United States Patent [19]

Yoshino et al.

[11] Patent Number: 4,538,167
[45] Date of Patent: Aug. 27, 1985

[54] SHORTED JUNCTION TYPE PROGRAMMABLE READ ONLY MEMORY SEMICONDUCTOR DEVICES

[75] Inventors: Hideo Yoshino; Eisuke Arai; Kazuhide Kiuchi, all of Tokyo, Japan

[73] Assignee: Nippon Telegraph & Telephone Public Corporation, Japan

[21] Appl. No.: 300,345

[22] Filed: Sep. 8, 1981

[30] Foreign Application Priority Data

Sep. 24, 1980 [JP] Japan ............................. 55-133260
Nov. 20, 1980 [JP] Japan ............................. 55-162565

[51] Int. Cl.³ .................... H01L 29/04; H01L 29/90; H01L 27/10; G11C 17/00
[52] U.S. Cl. ....................................... 357/59; 357/13; 357/15; 357/23.1; 357/23.7; 357/45; 357/49; 365/96; 365/105
[58] Field of Search ............... 357/23 R, 23 TF, 45, 357/15, 13, 59, 49; 365/96, 103, 104, 105

[56] References Cited

U.S. PATENT DOCUMENTS 3,781,825 12/1973 Burker et al. ........................ 357/15
3,787,717 1/1974 Fischer et al. ........................ 357/35
3,848,238 11/1974 Rizzi et al. ........................... 357/45
4,145,702 3/1979 Rau et al. ............................. 357/45
4,229,757 10/1980 Moussie ................................ 357/59
4,287,569 9/1981 Fukushima ............................ 365/96
4,376,984 3/1983 Fukushima et al. ................. 365/104

FOREIGN PATENT DOCUMENTS 2005078 4/1979 United Kingdom ............. 357/59 R

OTHER PUBLICATIONS

Ewald et al., "Fusible Link Device", IBM Technical Disclosure Bulletin vol. 19, (177), pp. 3089-3090.
Fukushima et al., "A High Speed Schottky 4K-Bit PROM...", 11th Conf. (1979 Int.) Solid State Devices, Tokyo, 8/79, Dig. Tech. Papers, pp. 75-76.
Geis et al., "Crystallographic Orientation of Silicon on an Amorphous Substrate...", Appl. Phys. Lett. vol. 35, (Jul. 1, 1979) pp. 71-74.
"Shorted Junction Type Prom Element Using Polysilicon", Distributed in Announcement in Conference of Inst. Electronics and Communication Engineers of Japan, Mar. 5, 1980, p. 2-109.

Primary Examiner—Gene M. Munson
Attorney, Agent, or Firm—Remy J. VanOphem

[57] ABSTRACT

The semiconductor device relates to a shorted junction type programmable read only memory semiconductor device. The memory consists of a semiconductor region including a PN junction or a Schottky junction and a control electrode coupled to the junction. The junction is destroyed or shorted by causing a field or carrier injection effect in the semiconductor region with a voltage impressed on the control electrode.

2 Claims, 9 Drawing Figures

SHORTED JUNCTION TYPE PROGRAMMABLE READ ONLY MEMORY SEMICONDUCTOR DEVICES

BACKGROUND OF THE INVENTION

1. Field of the Invention

This invention relates to a semiconductor memory device, and more particularly to a shorted junction type programmable read only memory (PROM) semiconductor device.

2. Description of the Prior Art

In a shorted junction type PROM semiconductor device, a destroy or breakdown phenomenon, at a junction, is uniquely utilized to provide a binary state corresponding to an information. Such PROM semiconductor device is disclosed for example in "Digest of Technical Papers" of The 11th Conf. (1979 International) on Solid State Devices, Tokyo, Pages 75 and 76, Aug. 27–29, 1979.

The PROM semiconductor device disclosed therein consists of a monocrystalline silicon substrate and an NPN junction structure, for example, formed in the longitudinal direction. This PROM semiconductor device is in a relatively high impedance state with a normal bias (for example, 5 V), that is, in a state not to enable writing of an information. To write an information in the PROM semiconductor device, a high voltage (for example 20 V) is applied across the junction to create a breakdown phenomenon so as to pass a large current through the junction to heat the same, thereby diffusing an electrode metal or an impurity in the semiconductor to destroy or short the junction to cause a low impedance state.

In the PROM semiconductor device of this construction, however, the write voltage is determined by the breakdown voltages of the individual junctions of the device and the breakdown voltages vary depending upon the impurity concentration of the semiconductor device or the configurations of the junctions. Accordingly, when the write voltage is set to a critical value, it is necessary to vary the write voltage in accordance with the non-uniformity of the breakdown voltage of the PROM device. For this reason, the write voltage is generally set to a value substantially higher than the breakdown voltage which is determined by taking into consideration the non-uniformity of the characteristics.

Of course, it is possible to decrease the breakdown voltage by reducing the breakdown strength of the junction for the purpose of lowering the write voltage with this measure. However, the possibility of erroneous writing of the information increases due to non-uniformity of the characteristics of the device of the conventional construction. When the write voltage is made higher, as above described, the design of the peripheral circuits becomes difficult which increases power consumption at the time of writing, thus making it impossible to save electric power.

In the prior construction described above, it is a common practice to form a PN junction in the semiconductor substrate. With this construction, however, the electric power supplied, at the time of writing for breaking down the junction, is used to also heat the semiconductor substrate itself, so that, in order to generate heat at the junction, in a quantity sufficient to destroy or short the same, it is necessary to use an excess amount of power, which is, of course, undesirable.

SUMMARY OF THE INVENTION

Accordingly, it is a principal object of this invention to provide an improved shorted junction type PROM semiconductor device capable of reducing the write voltage required by the prior art device.

Another object of this invention is to provide a semiconductor device, of the type described above, which can also reduce the write power required by the prior art device.

According to this invention, there is provided a shorted junction type PRO semiconductor device of the type having at least one junction which can be destroyed by applying thereacross a voltage higher than a breakdown voltage of the junction so as to change the state of the junction from a high to a low resistance state, for writing an information in the semiconductor device, characterized in that a control electrode is coupled to the junction, such that a voltage having a predetermined value with respect to the reference potential of the junction is applied to the control electrode for destroying the junction.

DESCRIPTION OF THE PREFERRED EMBODIMENT

Figure 1:
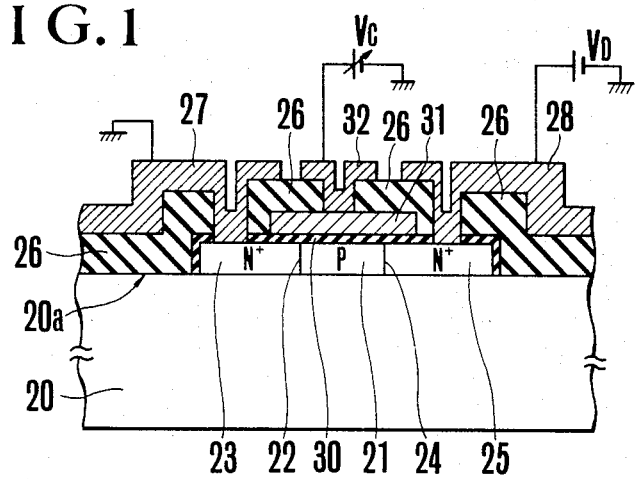
FIG. 1 is a longitudinal sectional view showing one embodiment of the shorted junction type PROM semiconductor device embodying the invention.

A shorted junction type programmable read only memory (PROM) semiconductor device shown in FIG. 1 consists of a substrate 20 made of by way of non-limiting example quartz glass, a region 21 of a P type monocrystalline silicon film formed on the major surface 20a of the substrate 20, a region 23 of an N+ type monocrystalline silicon film formed contiguous to one side of the region 21 to form a PN+ junction therebetween, and a region 25 including an N+ type monocrystalline silicon film contiguous to the opposite side of the region to form another PN+ junction therebetween. These regions are juxtaposed in the horizontal direction so as to form an N+PN+ junction structure.

An electroconductive layer 31 made of molybdenum or similar metal is formed above the upper surface of the region 21 through a silicon oxide film 30 having a thickness sufficient to apply field effect upon the region (for example 100 to 2000Å) to extend above portions of the regions 23 and 25. A silicon oxide film 26 is applied to cover the exposed upper surface of the substrate 20, the silicon oxide film 30, and the electroconductive film 31. A portion of the silicon oxide film 26 is removed to connect a conductive layer 32 made of aluminum, or the like, to the electroconductive layer 31 with an ohmic contact. Portions of the silicon oxide films 26 and 30 above the regions 23 and 25 are removed and then electroconductive layers 27 and 28 made of aluminum, for example, are formed on the silicon oxide film 26 to form ohmic contacts with the regions 23 and 25.

This semiconductor device can be manufactured by the following steps.

At first an amorphous silicon film is deposited on the major surface 20a of the quartz substrate by way of a nonlimiting example such as a vapor phase growth technique. Then, the amorphous silicon film is photoetched to leave portions which are used to form the various regions 21, 23 and 25. The remaining amorphous silicon film is crystallized using a laser annealing technique. Such laser annealing technique is disclosed, for example, in "Applied Physics Letters" vol. 35, No. 1, 1 July 1979, Pages 71-74. The silicon oxide film 30 having a thickness of about 500 angstroms is formed to cover the various regions 21, 23 and 25 and then the electroconductive layer 31 made of molybdenum is formed at a position corresponding to the region 23 and the junctions 22 and 24. Desired impurities are then introduced into respective regions to desired concentrations utilizing an ion implantation technique. For example, boron ions are implanted into the region 21 to a concentration of $10^{15}$ through $10^{18}$ atoms/cm$^3$, while arsenic ions are implanted into the regions 23 and 25 to a concentration of $10^{20}$ through $10^{21}$ atoms/cm$^3$. After forming the silicon oxide film 26 by the aforementioned vapor phase growth technique, the desired portions of the silicon oxide film 26 are etched off and then an aluminum film is formed by a vaccum evaporation method. The aluminum film is etched by using a pattern mask to form conductive layers 27, 28 and 32.

Figure 2:
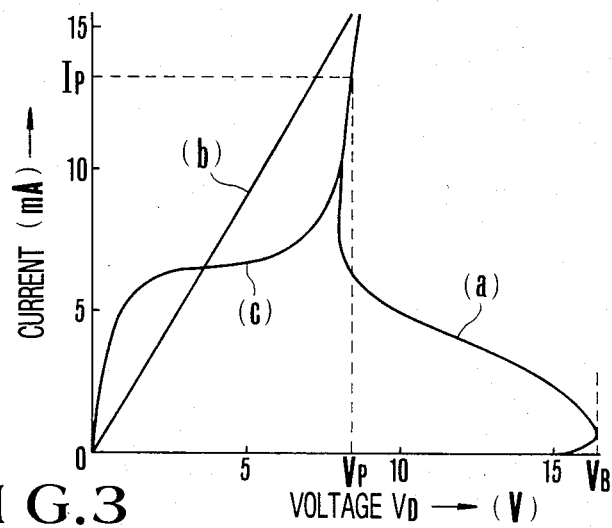
FIG. 2 shows voltage-current characteristic curves useful to explain the operation of the semiconductor device shown in FIG. 1.

This semiconductor device is used as a PROM element consisting of an N+ PN+ type semiconductor. When a voltage $V_D$ is applied across the electroconductive layers 27 and 28 without impressing voltage $V_C$ upon the electroconductive layer 31 acting as a control electrode, the semiconductor device will manifest a voltage-current characteristic as shown in FIG. 2. When the applied voltage $V_D$ is smaller than a breakdown or destroy voltage $V_B$, depending upon the polarity of the applied voltage, the PN+ junction 22 and 24 becomes nonconductive, thus blocking flow of the current so that the semiconductor device is in a high resistance state. However, when the applied voltage exceeds the breakdown voltage, $V_B$ the, PN+ junction 22 and 24 becomes conductive to begin to the pass current. More particularly, the current flows along the curve a, which initially manifests a negative resistance characteristic, and then a low resistance characteristic, thus instantly increasing the current. When the current is passed for a predetermined time, the PN+ junction 22 or 24 generates heat so that the impurity contained in the region 23 or 25 at a high concentration, diffuses into the region, 21 to reach the region 25 or 23 to destroy the PN+ region 22 or 24 resulting in the semiconductor device adapting a low resistance state, thereby manifesting a voltage-current characteristic as shown by curve b.

Further, depending upon the dimensions and impurity concentrations of the respective regions, eutectic alloys of the metal making up the conductive layer 27 or 28 and metals consisting of the regions 23 or 25 and 21 are introduced in the region 23 or 25 and the region 21 thereby destroying the PN+ junction 22 or 24. Consequently, unless a voltage higher than $V_B$ is impressed, the resistance between the conductive layers 27 and 28 of a high nature, but when a voltage exceeding $V_B$ is impressed the resistance becomes low, thus enabling writing of an information.

This PROM element has a voltage current characteristic as shown in FIG. 2. Thus, as a voltage is impressed across the electroconductive layer 27 and 28 without impressing a voltage upon the electroconductive layer acting as a control electrode, current flows according to curve a shown in FIG. 2 when the applied voltage exceeds the breakdown voltage $V_B$, thus manifesting a characteristic similar to curve a shown in FIG. 2. When a voltage $V_D$, for example $V_D=9$ V, is impressed across the conductive layers 27 and 28 with the conductive layer 32 supplied with a positive voltage $V_C$, for example $V_C=10$ V, current flows as shown by curve c, which means that writing of an information is made possible with a voltage $V_P$, for example $V_P=9$ V, much smaller than the breakdown voltage $V_B$. After the PN junction is destroyed or shorted and the information is written, the PROM element becomes a low resistance state represented by curve b.

Since in this embodiment the monocrystalline semiconductor regions 21, 23 and 25 are formed on the substrate 20 having a small heat conductivity and covered by a silicon oxide film 26, except portions electrically connected to the conductive layers 27 and 28, the heat generated at the PN+ junction 22 or 24 would not be transferred to the outside, thereby enabling to write an information in the PROM element with a low electric power. Moreover, since the PN+ junctions 22 and 24 are formed in the monocrystalline semiconductor films, it is possible to readily and accurately control their positions, thus improving the PN junction characteristic. This not only assures the high resistance state before writing but also improves the reliability of the PROM element.

Further, according to the device abovementioned, an information can be written with a low voltage in addition to the aforementioned characteristic enabling writing of the information program with a low electric power.

Although in the foregoing embodiment the N+ PN+ junctions are formed by three regions, if desired, the region 25 may be omitted to connect the conductive layer 28 to the region 21 with an ohmic contact. In this case, the PN+ junction is reduced to one, but it should be understood that the object of this invention can be accomplished by destroying at least one PN junction. Further, the N+PN+ combined semiconductor structure may be replaced by a P+NP+ combined semiconductor structure.

Figure 3:
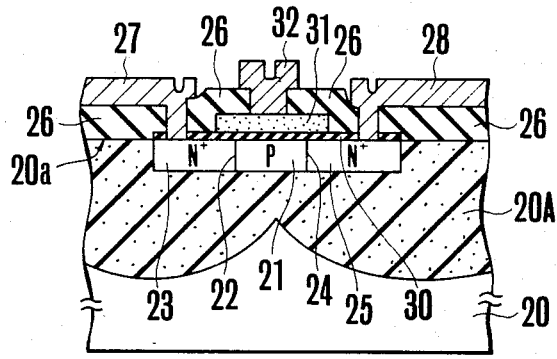
FIG. 3 is a longitudinal sectional view showing another embodiment of this invention.

FIG. 3 shows a modified embodiment of this invention in which elements identical or corresponding to those shown in FIG. 1 are designated by the same reference numerals. The PROM semiconductor device shown in FIG. 3 is formed by utilizing a full isolation by a porous oxidized silicon (FIPOS) technique. The difference of the present embodiment from the semiconductor device shown in FIG. 1 is in the construction of the N+PN+ semiconductor region wherein the N+PN+ region is surrounded by an insulating layer 20A. Such structure is manufactured by the following steps by way of a nonlimiting example. First, a P type monocrystalline silicon substrate 20 having a boron concentration of $1\times 10^{17}$ cm$^{-3}$ is prepared. The surface of the substrate 20, except a portion forming a semiconductor island region, is covered by a mask (not shown) for processing with the anodic reaction technique, to form a porous silicon region surrounding the island region. Such anodic reaction technique is disclosed in UK patent application GB No. 2,038,548A.

After thermal oxidization during seventy minutes in the atmosphere of wet $O_2$, a porous silicon oxide film layer 20A is formed, with the island remaining a monocrystalline silicon semiconductor region having about 0.5 microns in thickness and 20 microns in width in the porous silicon oxide layer 20A.

Further, a thin oxide film 30, having a thickness of 500 angstroms, is formed over the island, and an As-doped porycrystalline layer 31, having a width of 3 microns and a thickness of 0.5 microns, is formed on the oxide film 30 as a control electrode. Phosphorus ions are implanted into the semiconductor surface by using the polycrystalline silicon layer 31 as a mask to form an N+ semiconductor region. At this time, the concentration of the N+ semiconductor is about $10^{21}$ cm$^{-3}$. After heat-processing at 900° C. in the $N_2$ atmosphere, for example, an insulating film 26 consisting of a silicon oxide or phosphosilicate glass film with a thickness of 0.6 microns is formed on the semiconductor surface. Then after annealing, an aluminum electrode is deposited utilizing the through-hole technique. The operation of the device obtained thereby is similar to that of the device shown in FIG. 1. In the PROM semiconductor device manufactured in this manner, it is experimentally confirmed that when the voltage applied to the control electrode is 0 V the breakdown voltage is about 14 V and when the voltage is larger than 1 V the breakdown voltage reduces to one-half of the former breakdown voltage.

In this embodiment, the shorted junction function is controlled by the control electrode by utilizing a field effect similar to a MOS field effect transistor, but it should be understood that such function can also be controlled by a function similar to that of a bipolar transistor.

Figure 4:
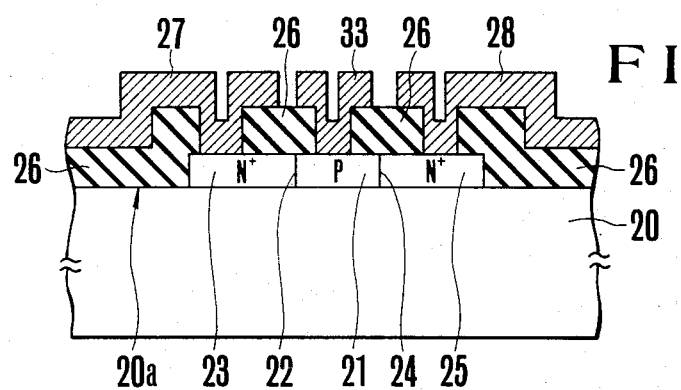
FIG. 4 is a longitudinal sectional view showing still another embodiment of this invention.

FIG. 4 is a longitudinal sectional view showing such modification in which elements identical or similar to those shown in FIG. 1 are designated by the same reference numerals. In FIG. 4, portions of the silicon oxide film 26 are removed to make a conductive layer 33 to have ohmic contacts with the regions 21, 23 and 25. The voltage-current characteristic of this PROM element is shown in FIG. 5.

Figure 5:
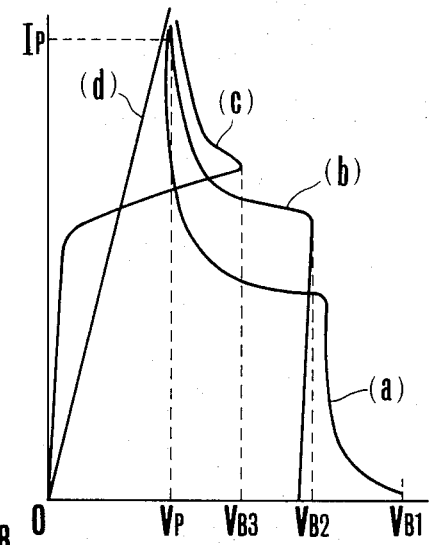
FIG. 5 shows voltage-current characteristic curves useful to explain the operation of the embodiment shown in FIG. 4.

When a voltage is impressed across the conductive layers, 27 and 28, with the conductive layer 33 acting as a control electrode supplied with a voltage that reversely biases the PN+ junction 22 or 24, a large current flows when the voltage exceeds a breakdown voltage $V_{B1}$ as shown by curve a in FIG. 5. Under a condition in which no voltage is applied to the conductive layer 33, a large current flows, after the applied voltage has exceeded a breakdown voltage $V_{B2}$, as shown by curve b in FIG. 5, whereas when a voltage that forwardly biases the PN+ junction 22 or 24 is impressed upon the conductive layer 33, a large current flows as shown by curve c in FIG. 5 when the applied voltage exceeds a breakdown voltage $V_{B3}$. The PN junction is destroyed or shorted by the heat generated by the current such that the PROM element comes to manifest a low resistance state, as shown by curve d, thus enabling to write an information. As above described, depending upon the value of the impressed voltage, the maximum voltage necessary to write an information becomes different, the voltage values being expressed by a relation $V_{B1}>V_{B2}>V_{B3}$. Consequently, as the control electrode is forwardly biased, a writing of the information becomes possible with a lower voltage.

Figure 6:
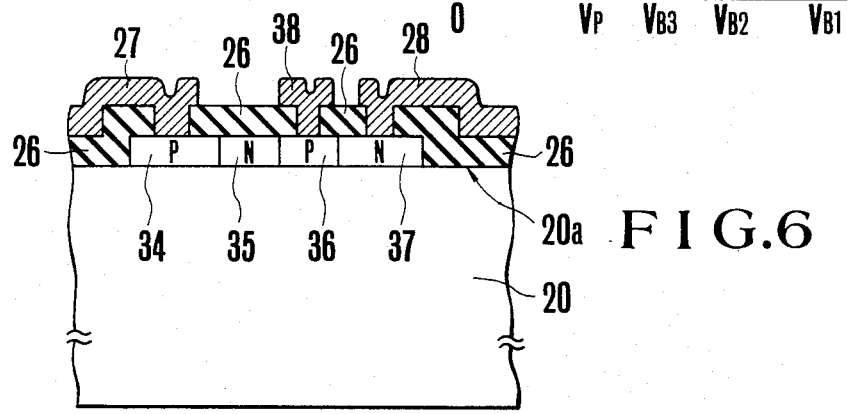
FIG. 6 is a longitudinal sectional view showing yet another embodiment according to this invention.
Figure 7:
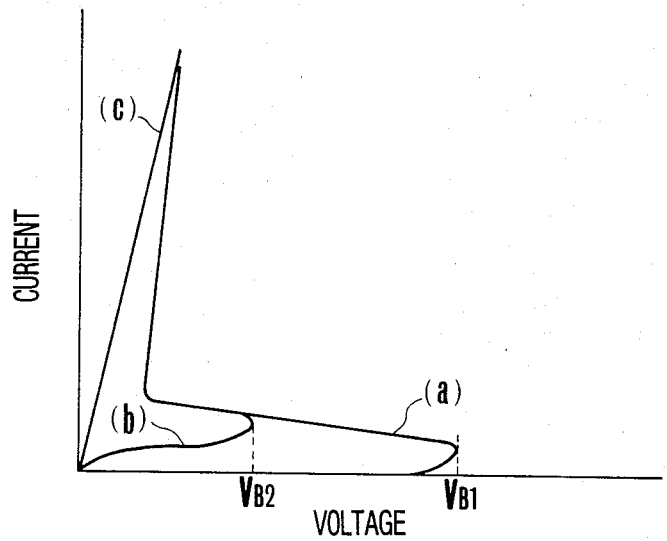
FIG. 7 shows voltage-current characteristic curves useful to explain the operation of the embodiment shown in FIG. 6.

FIG. 6 shows still another embodiment having PNPN junctions in which elements identical or similar to those shown in FIG. 1 are designated by the same reference numerals. On the major surface 20a of the substrate 20 are formed in the horizontal direction, a P type region 34 of a monocrystalline silicon film, an N type region 35 of a monocrystalline silicon film, a P type region 36 of a monocrystalline silicon film, and an N type region 37 made of a monocrystalline silicon film to form PNPN junctions. These regions and the exposed portions of the upper surface of the substrate 20 are covered by a silicon oxide film 26, and a portion thereof is removed to connect a conductive layer 38 of aluminum, or the like, to the P type region 36 with an ohmic contact. The other portions of the silicon oxide film 26 are also removed to connect the conductive layers 27 and 28 to the P type region 34, and the N type region 37 with ohmic contacts. The voltage-current characteristic obtained from the above device is shown in FIG. 7.

With a positive voltage applied to the conductive layer 27 and with the conductive layer 28 maintained at the ground potential, when the voltage of the conductive layer 38 acting as a control electrode is reduced to zero (that is the ground potential), the PN junction between the regions 35 and 36 would be biased reversely, so that current will not flow unless the voltage impressed upon the conductive layer 27 is increased. Therefore, as shown by the curve a in FIG. 7, a large current flows after the breakdown voltage exceeds $V_{B1}$. However, as the positive voltage is impressed upon the conductive layer 38 the breakdown voltage of the PN junction the between regions 35 and 36 would be decreased due to the injection of carriers. Therefore, as shown by the curve b, a large current flows after the breakdown voltage exceeds $V_{B2}$. By heating the PN junction, with the current, the PN junction is destroyed or shorted to take on a low resistance state as shown by the curve c in FIG. 7. Accordingly, a sufficiently large current flows even when a small voltage is impressed upon the conductive layer 27 so as to destroy the PN junction thereby enabling writing of an information. Although the combined semiconductor structure is a PNPN type, the structure may be replaced by a NPNP type structure.

In each of the above described embodiments it should be understood that the type and concentration of the impurity in respective regions can be suitably changed. Furthermore, instead of crystallizing a polycrystalline or amorphous semiconductor film by a laser annealing technique, other crystallization techniques such as electron beam annealing or ion beam annealing etc. can be used to form a monocrystalline silicon on an insulating porous silicon oxide film with a FIPOS technique. Further, a monocrystalline semiconductor film can be formed on a sapphire substrate by an epitaxial technique. Moreover, the materials that form PN junctions may be poycrystalline or amorphous semiconductors in place of the monocrystalline silicon.

Alumina, barium titanate, etc., having a low heat conductivity may be used as the substrate. Since a substrate as a whole, is required to have a low heat conductivity, a substrate prepared by forming a thick silicon oxide film, etc. acting as an insulating film on such an electroconductive substrate as a monocrystalline silicon substrate can also be used.

Where shorted junction phenomenon is used, a Schottky junction can be used instead of a PN junction. In this case, one of the semiconductor regions constituting the PN junction is replaced by a metal.

A PROM circuit device utilizing the semiconductor device embodying the invention will now be described.

Figure 8:
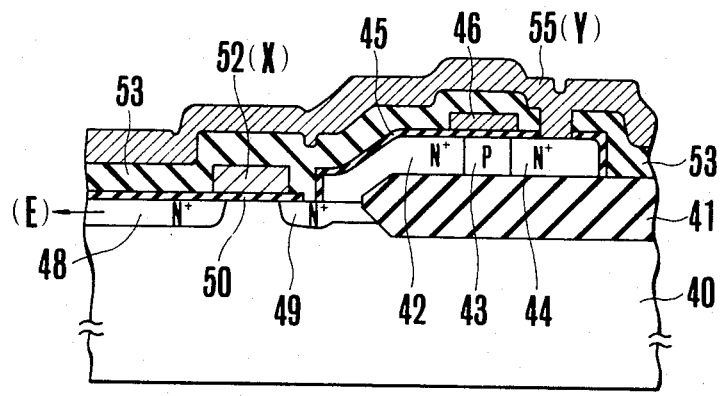
FIG. 8 is a longitudinal sectional view showing another embodiment of this invention.
Figure 9:
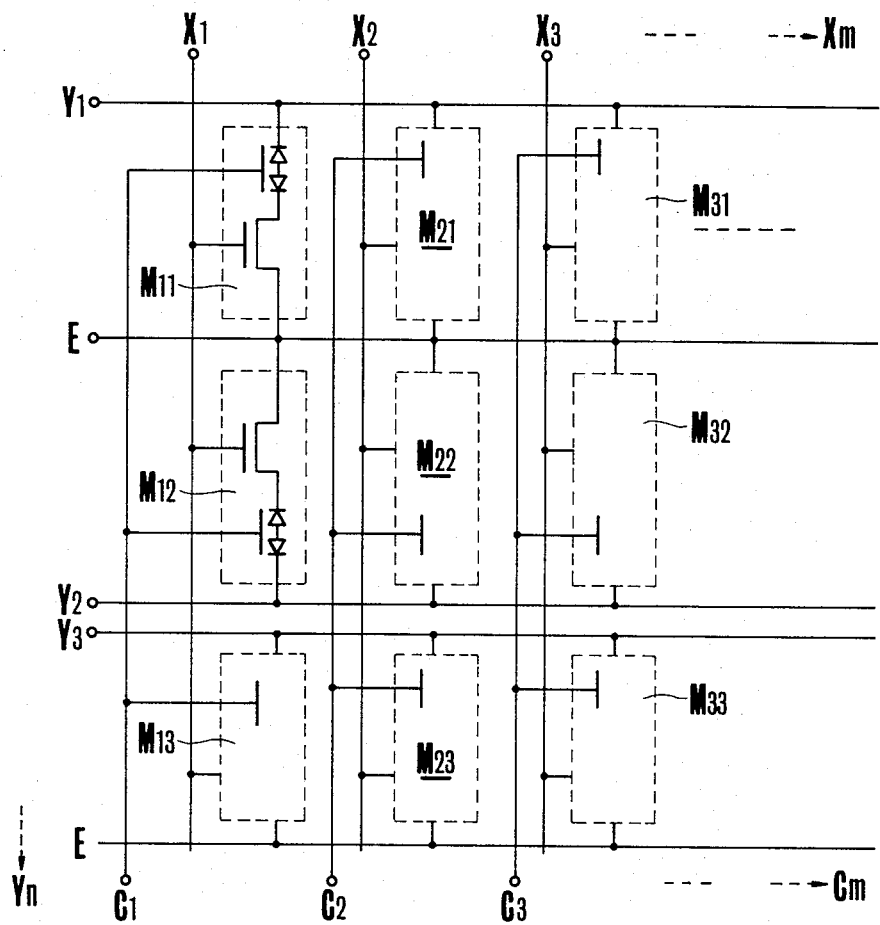
FIG. 9 is a connection diagram of an actual PROM device by connecting the semiconductor devices of this invention shown in FIG. 8 in a matrix form.

FIG. 8 shows a longitudinal section of a portion of the PROM circuit device and FIG. 9 shows the connection diagram thereof.

As shown in FIG. 8, a thick silicon oxide film 41 is formed on a predetermined portion of the major surface of a monocrystalline silicon substrate 40 and an N+ type region 42 of a monocrystalline silicon film, a P type region 43 of a monocrystalline silicon film, and an N+ type region 44 of a monocrystalline silicon film are juxtaposed on the silicon oxide film 41 in the horizontal direction to form N+PN+ regions. Over these regions 42, 43 and 44, an electroconductive layer 46 is formed through a thin insulating film 45. The region 42 is formed to extend from the left hand end of the silicon oxide film 41 to reach the major surface of the substrate 40 N+ type diffused layers 48 and 49 are formed on the major surface of the substrate 40 not formed with the silicon oxide film 41. A silicon oxide film 50, acting as a gate insulating film, is formed to cover a portion of the major surface of the substrate 40 and the diffused layers 48 and 49, and a conductive layer 52(x), acting as a control electrode, is formed on the silicon oxide layer 50 to bridge the opposing ends of the diffused layers 48 and 49. The diffused layers 48 and 49, the silicon oxide film 50 and the conductive layer 52(x) formed on the surface of the substrate 40 constitute a MOS FET. After covering all of these elements with a silicon oxide film 53, a portion thereof is removed to connect an electroconductive layer 55(Y), made of aluminum, by way of non-limiting example, to the N+ region 44 with an ohmic contact. Portions of the silicon oxide films 50 and 53, are removed to electrically connect the conductive layer, not shown, with an ohmic contact to the diffused layer 48. As above described, a MOS FET and a PROM element are connected in series to form a memory cell.

A plurality of such memory cells are connected in a matrix as shown in FIG. 9 to form a programmable read only memory device.

As shown in FIG. 9, memory cells $M_{ll}$ through $M_{mn}$ are connected between column read or write control wires, $X_l$ through $X_m$, rows write or read current supply lines $Y_l$ through $Y_n$ and grounded lines E, in a manner well known in the art. Each of the symbols $C_l$-$C_m$ represents a write control line for commonly connecting the control electrodes of the PROM cells arrayed along each column.

To write an information into the memory cell $M_{ll}$, voltages sufficient to turn "on" the MOS FET and to lower the breakdown voltage of the PN junction of the PROM element are applied to the control wire $X_l$ and write control wire C, respectively and, concurrently therewith a voltage higher than the breakdown voltage of the PN junction of the PROM element is applied. Then only the PROM element of the memory cell $M_{ll}$ becomes conductive, such that its PN junction is destroyed to manifest a low resistance state. Consequently, an information would be stored in the memory cell $M_{ll}$. To read out the stored information, voltages are impressed upon the control wire $X_l$ and the read current detecting wire $Y_l$. Then, only the memory cell $M_{ll}$ passes current between the wires $Y_l$ and E, and the current is detected as an information of "1", for example. When a writing is not made, the PROM element of the memory cell is in a high resistance state, so that no current flows even when voltages are impressed upon its control wire and read current detecting wire, such state being detected to read out "0", for example. As above described, it is possible to select any desired memory cell to write into and read out information.

As above described, according to the semiconductor device embodying the invention, it is possible to write an information into the PROM element with a small electric power and when a control electrode is added, it becomes possible to write an information even with a low voltage. Accordingly, where a PROM circuit device is fabricated with these semiconductor devices it is possible to write a program with lower electric power and voltage than the prior art device thus simplifying the design of the peripheral circuit and improving the reliability and the density of the integrated circuit.

What is claimed is:

1. In a shorted junction type programmable read only memory device of the type having a substrate and at least one PN junction which can be shorted by applying thereacross a voltage higher than a breakdown voltage of the PN junction changing the resistance state of the PN junction from high to low, the improvement comprising:
   a first insulating layer disposed on said substrate of said read only memory device;
   three adjacent semiconductor regions disposed on said first insulating layer, said three semiconductor regions comprising a middle region and two side regions, each said side region forming a PN junction with said middle region;
   a second insulating region disposed over said three regions having three contact holes, one over each of said three adjacent regions;
   two independent conductors for receiving a voltage therebetween sufficient to destroy one of said PN junctions, one of said conductors connected to one of said two side regions through one of said contact holes and said other conductor connected to said other side region through a second of said contact holes; and
   a third independent conductor, in ohmic contact with said middle semiconductor region through said third contact hole in said second insulating layer, for applying a predetermined voltage to said middle semiconductor region to reduce the voltage necessary to destroy one of said PN junctions 2. A shorted junction type programmable read only memory device having at least one element that has a PN junction which can be shorted by applying thereacross a predetermined voltage higher than the breakdown voltage of the junction, said read only memory device comprising:
   a quartz substrate;
   three adjacent regions laterally disposed on the surface of said quartz substrate, said three adjacent regions comprising a semiconductor middle region and two side regions, one on either side of said middle region, said two side regions each forming a PN junction with said middle region;

an insulating layer disposed over said three regions having two contact holes, one above each of said two side regions;

a control electrode disposed on said second insulating layer overlaying said semiconductor middle region and said PN junctions;

two independent conductors for receiving a voltage therebetween sufficient to destroy one of said PN junctions, one of said conductors connected to one of said two side regions through one of said contact holes and said other of said two conductors connected to said other side region through said other of said contact holes; and a third conductor connected to said control electrode for applying a predetermined voltage to said control electrode to reduce the voltage applied across said two side regions necessary to breakdown and short one of said PN junctions.

* * * * *

UNITED STATES PATENT AND TRADEMARK OFFICE
CERTIFICATE OF CORRECTION

PATENT NO. : 4,538,167
DATED : August 27, 1985               Sheet 1 of 2
INVENTOR(S) : Yoshino et al.

It is certified that error appears in the above-identified patent and that said Letters Patent is hereby corrected as shown below:

Column 1, line 4, In the Title delete "DEVICES" and insert ---- DEVICE ----.

Column 2, line 12, delete "PRO" and insert ---- PROM ----.

Column 2, line 45, delete comma "," and insert ---- ; ----.

Column 3, line 29, delete "the" second occurrence.

Column 3, line 56, delete "$V_B$the," and insert ---- $V_B$, the ----.

Column 5, line 14, delete "20A".

Column 5, line 20, delete "porycrystalline" and insert ---- polycrystalline ----.

Column 7, line 34, delete "52(x)," and insert ---- 52(X), ----.

Column 7, line 39, delete "52(x)" and insert ---- 52(X) ----.

Column 7, line 52, delete "$M_{11}$" and insert ---- $M_{11}$ ----.

Column 7, line 54, delete "$X_1$" and insert ---- $X_1$ ----.

Column 7, line 55, delete "$Y_1$" and insert ---- $Y_1$ ----.

Column 7, line 56, delete "$C_1$" and insert ---- $C_1$ ----.

Column 7, line 60, delete "$M_{11}$" and insert ---- $M_{11}$ ----.

UNITED STATES PATENT AND TRADEMARK OFFICE
CERTIFICATE OF CORRECTION

PATENT NO. : 4,538,167
DATED : August 27, 1985
INVENTOR(S) : Yoshino et al.

Sheet 2 of 2

It is certified that error appears in the above-identified patent and that said Letters Patent is hereby corrected as shown below:

Column 7, line 63, delete "$X_1$" and insert ---- $X_1$ ----.

Column 7, line 67, delete "$M_{11}$" and insert ---- $M_{11}$ ----.

Column 8, line 3, delete "$M_{11}$" and insert ---- $M_{11}$ ----.

Column 8, line 4, delete "$X_1$" and insert ---- $X_1$ ----.

Column 8, line 5, delete "$Y_1$" and insert ---- $Y_1$ ----.

Column 8, line 6, delete "$M_{11}$" and insert ---- $M_{11}$ ----; same line, delete "$Y_1$" and insert ---- $Y_1$ ----.

Column 8, line 23, after "device" insert a comma ---- , ----.

Column 8, line 57, after "junctions" insert a period ---- . ----.

Signed and Sealed this

Nineteenth Day of November 1985

[SEAL]

Attest:

DONALD J. QUIGG

Attesting Officer

Commissioner of Patents and Trademarks